United States Patent
Shida et al.

(10) Patent No.: US 7,572,391 B2
(45) Date of Patent: Aug. 11, 2009

(54) FLUORESCENT SUBSTANCE AND LIGHT-EMITTING DEVICE USING THE SAME

(75) Inventors: Naomi Shida, Tokyo (JP); Masaaki Tamatani, Fujisawa (JP); Yoshihito Tsutsui, Chigasaki (JP); Kazuaki Ootsuka, Yokosuka (JP); Ryosuke Hiramatsu, Kawasaki (JP)

(73) Assignees: Kabushiki Kaisha Toshiba, Tokyo (JP); Toshiba Materials Co., Ltd, Kanagawa (JP)

( * ) Notice: Subject to any disclaimer, the term of this patent is extended or adjusted under 35 U.S.C. 154(b) by 0 days.

(21) Appl. No.: 12/142,078

(22) Filed: Jun. 19, 2008

(65) Prior Publication Data

US 2008/0251765 A1    Oct. 16, 2008

Related U.S. Application Data

(63) Continuation of application No. 11/249,946, filed on Oct. 13, 2005.

(30) Foreign Application Priority Data

Oct. 18, 2004    (JP)    ............... 2004-303509

(51) Int. Cl.
  *C09K 11/59*    (2006.01)
  *C09K 11/55*    (2006.01)
(52) U.S. Cl. ............... 252/301.4 F; 428/403; 427/215
(58) Field of Classification Search ............ 252/301.4 F
  See application file for complete search history.

(56) References Cited

U.S. PATENT DOCUMENTS

| 6,621,211 B1 | 9/2003 | Srivastava et al. |
| 2006/0011936 A1 | 1/2006 | Hiramatsu et al. |

FOREIGN PATENT DOCUMENTS

| JP | 2003-142004 | 5/2003 |
| WO | 2005/027231 | 3/2005 |
| WO | 2006/043682 | 4/2006 |

OTHER PUBLICATIONS

International Search Report for PCT/JP2005/019441 dated Feb. 8, 2006.
Written Opinion of the International Search Report for PCT/JP2005/019441 dated Feb. 8, 2006.

(Continued)

*Primary Examiner*—C. Melissa Koslow
(74) *Attorney, Agent, or Firm*—Turocy & Watson, LLP

(57) ABSTRACT

An field effect transistor includes a first semiconductor region, a gate electrode insulatively disposed over the first semiconductor region, source and drain electrodes between which the first semiconductor region is sandwiched, and second semiconductor regions each formed between the first semiconductor region and one of the source and drain electrodes, and having impurity concentration higher than that of the first semiconductor region, the source electrode being offset to the gate electrode in a direction in which the source electrode and the drain electrode are separated from each other with respect to a channel direction, and one of the second semiconductor regions having a thickness not more than a thickness with which the one of second semiconductor regions is completely depleted in the channel direction being in thermal equilibrium with the source electrode therewith.

20 Claims, 8 Drawing Sheets

OTHER PUBLICATIONS

S.H.M. Poort, et al., Optical Properties of Eu 2+-Activated Orthosilicates and Orthophosphates, Journal of Alloys and Compunds, 260 (1997) 93-97.

G. Blass, et al., Fluorescence of Eu2+- Activated Silicates, Philips Res. Repts 23, 189-200, 1968.

Derwent Abstract for KR 2004088446 A, Oct. 16, 2004.

Derwent Abstract for KR 2003060697 A, Jul. 16, 2003.

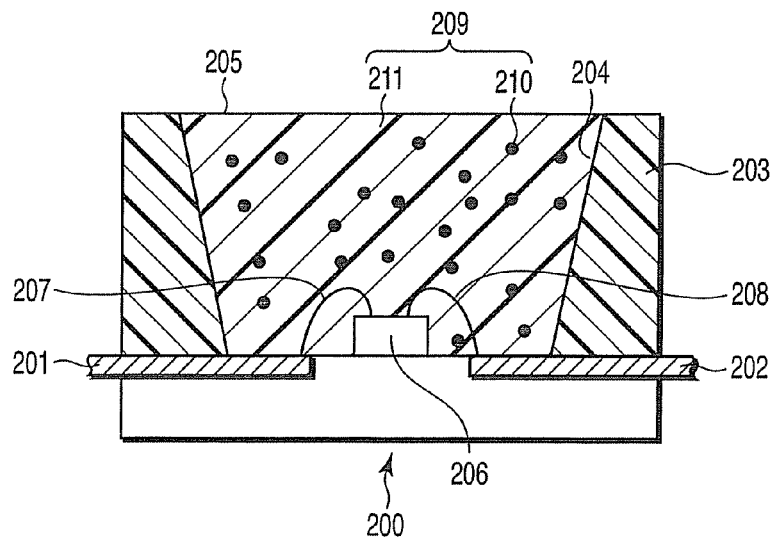
F I G. 1
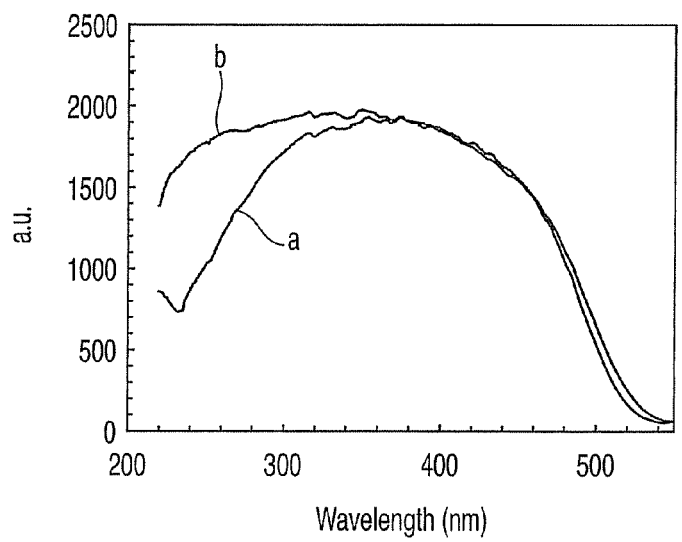
F I G. 2
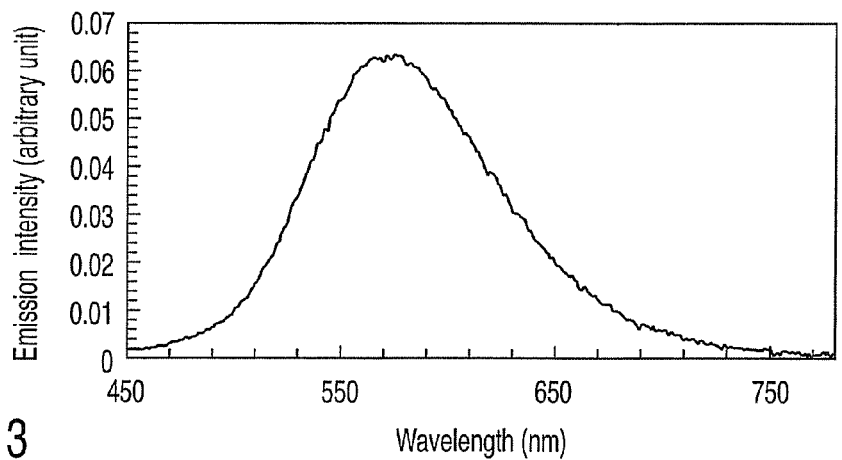
F I G. 3

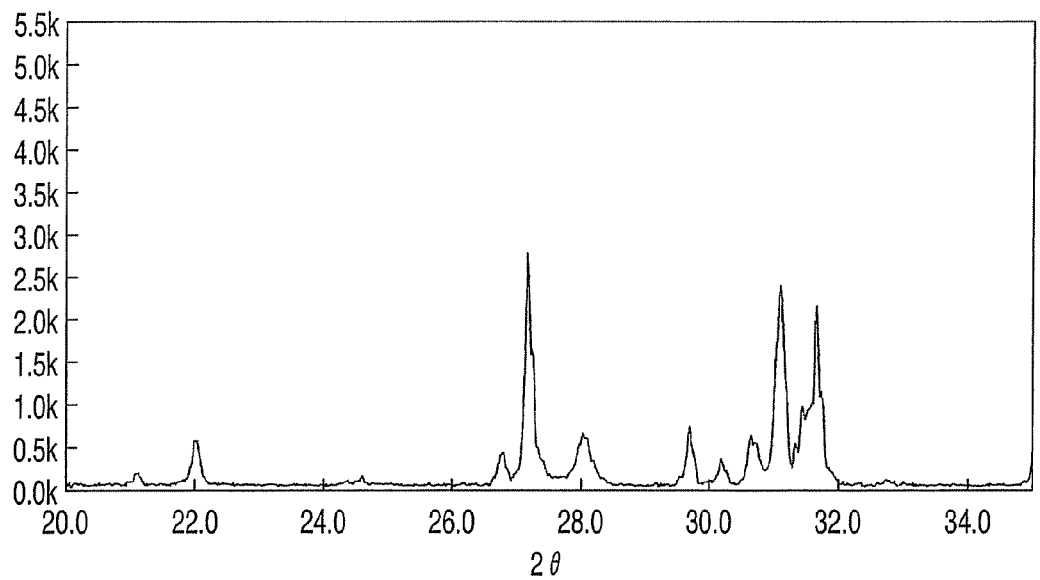
F I G. 4
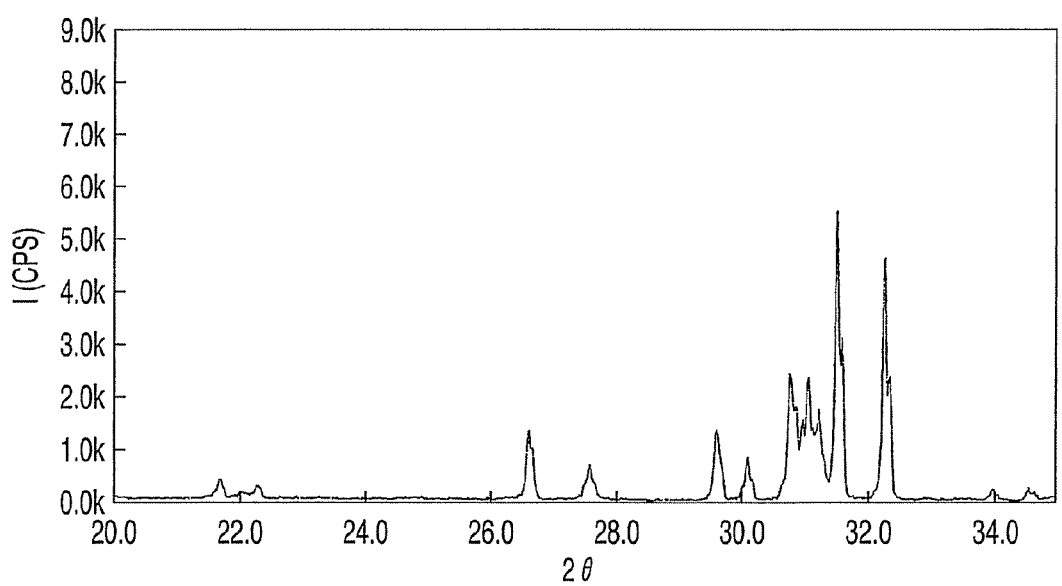
F I G. 5

US 7,572,391 B2

FLUORESCENT SUBSTANCE AND LIGHT-EMITTING DEVICE USING THE SAME

CROSS-REFERENCE TO RELATED APPLICATIONS

This application claims the benefit of priority from and is a continuation of application Ser. No. 11/249,946 filed Oct. 13, 2005, which is based upon and claims the benefit of priority from prior Japanese Patent Application No. 2004-303509, filed Oct. 18, 2004, the entire contents of both applications are incorporated herein by reference. Application Ser. No. 12/023,677, which is also a continuation of application Ser. No. 11/249,946, is incorporated herein by reference.

BACKGROUND OF THE INVENTION

1. Field of the Invention

This invention relates to a silicate fluorescent substance to be employed in a display device, an illuminator or various light sources, and to a light-emitting device employing the silicate fluorescent substance.

2. Description of the Related Art

A light-emitting diode (hereinafter referred to as LED) which is composed of a combination of a light-emitting element as an excitation light source and a fluorescent substance is well known. In this LED, it is possible, through variously changing the combination of the light-emitting element and the fluorescent substance, to realize various luminescent colors. Among them in particular, in order to realize a light-emitting device which is capable of emitting white light or so-called white LED, there have been proposed various methods such as a method wherein a light-emitting element which is capable of mainly emitting blue light and a yellow fluorescent substance are employed as a combination, and a method wherein a light-emitting element which is capable of emitting near-ultraviolet ray, a blue fluorescent substance, a yellow fluorescent substance and a red fluorescent substance are employed as a combination. As for the yellow fluorescent substance to be employed in the white LED, although a YAG fluorescent substance is well known, since the YAG fluorescent substance is weak in luminescence when it is excited with light having a wavelength ranging from 360 nm to 410 nm, the employment thereof is limited to an LED where a blue light source is employed.

As for the yellow fluorescent substance which is capable of emitting yellow light as an emission spectrum when it is excited with light having a wavelength ranging from 360 nm to 500 nm, there is known a silicate fluorescent substance having a composition represented by: $M_2SiO_4$:Eu. Among them, although one having a composition of: $Ba_2SiO_4$:$Eu^{2+}$ is limited in crystal structure to orthorhombic system, one having a composition of: $Sr_2SiO_4$:$Eu^{2+}$ is reported to change its crystal structure from monoclinic system at a temperature of not more than 85° C. to orthorhombic system at a temperature higher than 85° C.

The luminescence of the orthorhombic system of $Ba_2SiO_4$:$Eu^{2+}$ and of the monoclinic system of $Sr_2SiO_4$:$Eu^{2+}$ would be greenish yellow having a peak wavelength of 520-540 nm or so. When a portion of Sr of $Sr_2SiO_4$:$Eu^{2+}$ is replaced by Ba, it would become possible to obtain the orthorhombic system even at room temperature and the luminescence thereof would become yellow of high color purity having a peak wavelength of 570 nm. Therefore, in order to obtain yellow luminescence of high color purity in a silicate fluorescent substance represented by a composition of $M_2SiO_4$:Eu, it is indispensable to include Ba. Further, in order to obtain an emission band having a desirable wavelength within the range of 520 to 600 nm, it is required to adjust the composition of fluorescent substance through the control of the content of Ba.

However, since a Ba compound has a bad influence on human body, the employment thereof is restricted by the toxic substance control regulations. Therefore, even if the fluorescent substance containing Ba compound is capable of emitting yellow luminescence of high color purity, the content of Ba compound should preferably be limited as minimal as possible.

BRIEF SUMMARY OF THE INVENTION

A fluorescent substance according to one aspect of the present invention comprises an alkaline earth ortho-silicate, the fluorescent substance being activated by $Eu^{2+}$, and further comprising at least one selected from the group consisting of La, Gd, Cs and K.

A light-emitting device according to another aspect of the present invention comprises a light-emitting element capable of emitting light at wavelength of 360 nm to 500 nm, and a layer of fluorescent substance formed on the light-emitting element, the fluorescent substance comprising an alkaline earth ortho-silicate, the fluorescent substance being activated by $Eu^{2+}$, and further comprising at least one selected from the group consisting of La, Gd, Cs and K.

BRIEF DESCRIPTION OF THE SEVERAL VIEWS OF THE DRAWING

FIG. 1 is a cross-sectional view schematically illustrating the structure of a light-emitting device according to one embodiment of the present invention;

FIG. 2 is a graph illustrating an excitation spectra of the fluorescent substances of Example 1 and Comparative Example 2;

FIG. 3 is a graph illustrating an emission spectrum of the fluorescent substance of Example 1;

FIG. 4 is a graph illustrating an X-ray diffraction pattern of the fluorescent substance of Example 1;

FIG. 5 is a graph illustrating an X-ray diffraction pattern of the conventional $Sr_2SiO_4$:Eu (monoclinic system);

DETAILED DESCRIPTION OF THE INVENTION

Figure 6:
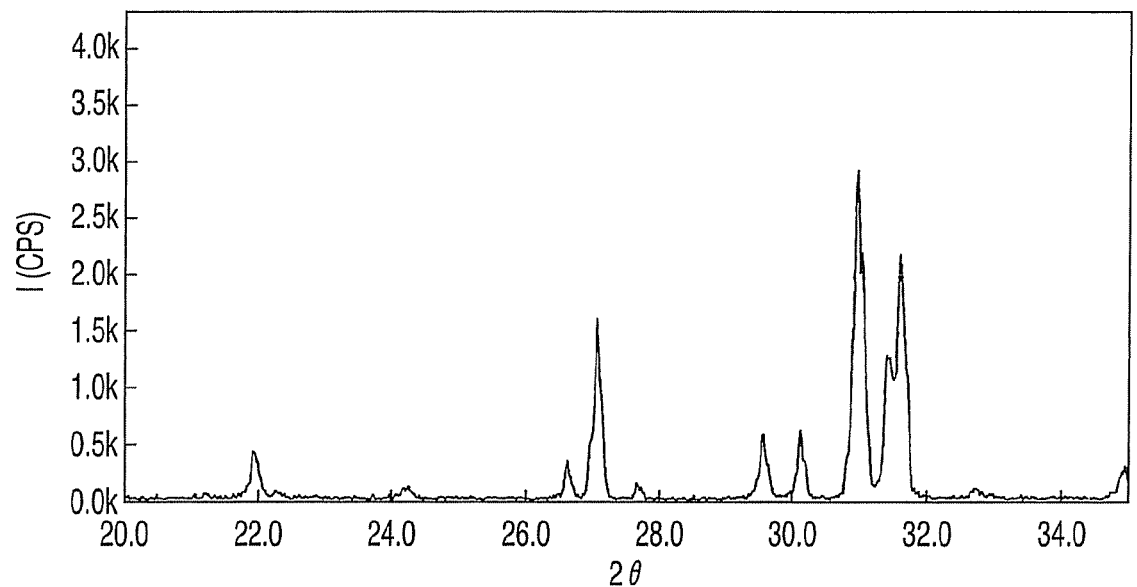
FIG. 6 is a graph illustrating an X-ray diffraction pattern of the conventional $(Sr,Ba)_2SiO_4$:Eu (orthorhombic system)

Next, embodiments of the present invention will be illustrated.

As a result of extensive studies made by the present inventors, it has been found out that in the case of a fluorescent substance made of alkaline earth ortho-silicate and activated by $Eu^{2+}$, there are elements which are capable of changing the crystal structure of the fluorescent substance from monoclinic system to orthorhombic system in the same manner as Ba. As such elements, it is possible to employ at least one selected from La, Gd, Cs and K. These elements are substantially non-poisonous to human body. The present invention has been accomplished based on the aforementioned findings.

The fluorescent substance made of Ba-containing alkaline earth ortho-silicate and activated by $Eu^{2+}$ can be represented by the following general formula (1).

$$(Sr,Ca,Ba,Eu)_2SiO_4 \qquad (1)$$

The fluorescent substance according to one embodiment of the present invention can be represented by the following general formula (2) for instance.

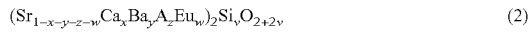
$$(Sr_{1-x-y-z-w}Ca_xBa_yA_zEu_w)_2Si_vO_{2+2v} \qquad (2)$$

(in the general formula (2), A is at least one selected from the group consisting of La, Gd, Cs and K; and x, y, z, w and v are numeric values satisfying the following relationships: $0>x>0.8$; $0\leq y\leq 0.6$; $0\leq z\leq 0.1$; $0.001\leq w\leq 0.2$; $0<(1-x-y-z-w)<1$; and $0.9\leq v\leq 1.1$)

If the content of Ca is excessive, the emission efficiency of fluorescent substance would be degraded. However, if the content (x) of Ca is limited to not more than 0.8, such degradation can be avoided. Further, when the influence of Ba on human body is taken into account, the content of Ba should preferably be as minimal as possible. Although it is most preferable that y=0, Ba may be included to a certain extent in order to adjust the emission wavelength. In this case, as long as y is confined to not more than 0.6, the influence of poisonous Ba can be minimized.

The element A other than alkaline earth metal elements is at least one selected from La, Gd, Cs and K. These elements may be employed singly or in combination of two or more. If the content of these elements is too large, it will lead to the generation of hetero-phase, thus degrading the emission efficiency of fluorescent substance. Thus, when the numeric value of z is confined to not more than 0.1, the aforementioned problem would be overcome.

As shown in the aforementioned general formula (2), the fluorescent substance according to the embodiment of the present invention is a silicate compound activated by $Eu^{2+}$. The compositional ratio w of Eu should preferably be confined to the range of 0.001 to 0.2. If w is less than 0.001, it may become difficult to secure a sufficient luminance intensity. On the other hand, if w is more than 0.2, the luminance intensity of fluorescent substance may be degraded due to concentration quenching.

Further, the compositional ratio v of Si should preferably be confined to the range of 0.9 to 1.1. If v is less than 0.9, a second emission band having a wavelength of nearly 500 nm generates, thus leading to the spreading of emission spectrum. On the other hand, if v is more than 1.1, it may become difficult to secure a sufficient luminance intensity. Therefore, v should preferably be confined within the range of 0.95 to 1.05.

The fluorescent substance according to one embodiment of the present invention can be synthesized according to the following procedure.

First of all, the oxide powder of each of constituent elements is weighed to obtain a predetermined quantity thereof. Then, by ball mill, etc., oxide powders of these constituent elements thus weighed are mixed with each other together with a suitable quantity of ammonium chloride employed as a crystal growth-promoting agent. It is also possible to employ various compounds which can be turned into oxides through the thermal decomposition thereof. For example, it is possible to employ $Eu_2O_3$, etc. as a raw material for Eu; $CaCO_3$, etc. as a raw material for Ca; $SrCO_3$, etc. as a raw material for Sr; $BaCO_3$, etc. as a raw material for Ba; $La_2O_3$, etc. as a raw material for La; $Gd_2O_3$, etc. as a raw material for Gd; CsCl, etc. as a raw material for Cs; KCl, etc. as a raw material for K; and $SiO_2$, etc. as a raw material for Si. If any of these raw material powders are capable of acting as a crystal growth-promoting agent, an additional crystal growth-promoting agent such as ammonium chloride may not necessarily be separately incorporated into a mixture of the aforementioned oxide powders.

As for the crystal growth-promoting agent, it is possible to employ, other than ammonium chloride, chlorides, bromides or iodides of ammonium, alkaline metal or alkaline earth metal. In order to prevent any substantial increase in hygroscopicity of fluorescent substance, the content of crystal growth-promoting agent should preferably be confined to the range of about 0.5 to 30% by weight based on an entire quantity of raw material powders.

Thereafter, a mixture of raw materials is placed in a crucible and pre-fired (pre-baked) for 1 to 3 hours in air atmosphere at a temperature ranging from 500 to 700° C. The fired (baked) material thus obtained is further subjected to mixing and then firing (baking) for 3 to 7 hours in a reducing atmosphere consisting of a mixed gas of $N_2/H_2$ at a temperature ranging from 1000 to 1600° C. A first fired product thus obtained is pulverized and again placed into a vessel. With respect to the degree of pulverization, there is not any particular limitation. Namely, the pulverization can be performed by mortar to such an extent that agglomerates that have been generated due to the firing can be pulverized to increase the surface area of the fired powder.

The pulverized powder is again placed in a furnace, which is then purged with nitrogen gas in vacuum. The vacuum on this occasion should preferably be 1000 Pa or less. If the degree of vacuum is higher than 1000 Pa, the water adhered onto the raw material cannot be removed.

Then, the aforementioned first fired product is further subjected to firing for 2 to 6 hours in a reducing atmosphere consisting of $N_2/H_2$ and having a hydrogen concentration of 5% to 100% at a temperature ranging from 1000 to 1600° C. The fired product thus obtained is pulverized by mortar and sieved using a sieve of suitable mesh size, thereby obtaining a fluorescent particle consisting of an alkaline earth orthosilicate represented by the aforementioned general formula (2).

The fluorescent particle according to one embodiment of the present invention may provide with a surface-covering material on its surface. The covering material can be formed of at least one selected from the group consisting of silicone resin, epoxy resin, fluorinated resin, tetraethoxy silane (TEOS), silica, zinc silicate, aluminum silicate, calcium polyphosphate, silicone oil, and silicone grease. It is possible, with the employment of this covering material, to provide the fluorescent substance with moisture-preventing properties. The zinc silicate and aluminum silicate can be represented for example by $ZnO\text{-}aSiO_2(1\leq a\leq 4)$, $Al_2O_3\text{-}bSiO2(1\leq b\leq 10)$, respectively. The surface of the fluorescent particle may not necessarily be completely covered with the covering material but the surface of the fluorescent particle may be partially exposed. As long as the covering material consisting of any of the aforementioned materials is existed on the surface of the fluorescent particle, it is possible to obtain the moisture-preventing properties.

The covering material can be applied to the surface of fluorescent particle by using a dispersion or solution thereof. Specifically, the fluorescent particle is immersed in a dispersion or solution of the covering material for a prescribed period of time and then dried by heating, etc. to deposit the covering material on the surface of fluorescent particle. In order to secure the effects of the covering material without badly affecting the inherent properties of fluorescent substance, the ratio of the covering material should preferably be confined within the range of about 0.1 to 50% by volume based on the fluorescent substance.

FIG. 1 shows a cross-sectional view schematically illustrating a light-emitting device according to one embodiment of the present invention.

In the light-emitting device shown in FIG. 1, a resinous stem 200 comprises a pair of leads 201 and 202 forming a lead frame, and a resin portion 203 formed integral with the lead frame. The resin portion 203 includes a recess 205 having an upper opening, an area of which is made larger than that of the bottom thereof. The inner wall of this recess 205 is formed into a light-reflection surface 204.

On a central portion of the circular bottom of recess 205, there is mounted a light-emitting chip 206 by a Ag paste, etc. As for the light-emitting chip 206, it is possible to employ one emitting ultraviolet luminescence or one emitting luminescence of visible light range. For example, it is possible to employ GaAs-based or GaN-based semiconductor light-emitting elements. The electrodes (not shown) of light-emitting chip 206 are connected, through a bonding wire 207 and a bonding wire 208, with a lead 201 and a lead 202, respectively. Incidentally, the arrangement of the lead 201 and the lead 202 can be optionally altered.

A fluorescent layer 209 is disposed in the recess 205 of resin portion 203. This fluorescent layer 209 can be formed by dispersing a fluorescent substance 210 proposed by one embodiment of the present invention into a resin layer 211 made of silicone resin for example at an amount ranging from 5 to 50% by weight.

As for the light-emitting chip 206, it is possible to employ those of flip chip type where an n-type electrode and a p-type electrode are disposed on the same surface. In this case, it is possible to prevent the disconnection or peeling of wire or to overcome problems originating from wire such as photoabsorption by wire, thereby making it possible to obtain a semiconductor light-emitting device which is excellent in reliability and luminescence intensity. Further, by using an n-type substrate for the manufacture of the light-emitting chip 206, the following structure can be created. More specifically, an n-type electrode is formed on the rear surface of an n-type substrate, a p-type electrode is formed on the upper surface of semiconductor layer on the substrate, and the n-type electrode or the p-type electrode is mounted on one of leads. Further, the p-type electrode lead or the n-type electrode is connected via wire with the other lead.

The size of the light-emitting chip 206 and the size and configuration of the recess 205 can be optionally altered. In the case of fluorescent substance according to one embodiment of the present invention, when it is excited by a light having a wavelength ranging from 360 nm to 500 nm, it will emit luminescence of green-yellow-orange colors having a wavelength ranging from 520 nm to 600 nm. In other words, the fluorescent substance according to one embodiment of the present invention emits luminescence of colors ranging from green to orange. More specifically, the emission spectrum of the fluorescent substance according to one embodiment of the present invention includes a single emission band having a wavelength falling between 520 nm and 600 nm. Incidentally, by the expression of "a single emission band", it means that the spectrum has a single emission peak or a band structure which is free from a shoulder-like up and down. When the fluorescent substance according to one embodiment of the present invention is employed in combination with a blue-emitting fluorescent substance and a red-emitting fluorescent substance, it will be also possible to obtain white beam.

Since the fluorescent substance according to one embodiment of the present invention has a orthorhombic structure, it is possible, through the fluorescent layer containing this fluorescent substance, to obtain a light-emitting device which is capable of emitting luminescence excellent in color purity.

The present invention will be further explained in detail with reference to examples and comparative examples. However, it should not be construed that the present invention is limited to these examples.

EXAMPLE 1

First of all, a fluorescent substance having a composition represented by $(Sr_{0.915}La_{0.06}Eu_{0.025})_2SiO_4$ was prepared. As raw material powders, $SrCO_3$ powder, $La_2O_3$ powder, $Eu_2O_3$ powder and $SiO_2$ powder were prepared and weighed to obtain a prescribed quantity of mixed powders. As a crystal growth-promoting agent, $NH_4Cl$ was added to the mixed powders at an amount of 1.5% by weight based on a total quantity of the mixed powders and the resultant mixture was homogeneously mixed together by ball mill.

The mixed raw material thus obtained was introduced into a lidded alumina crucible and pre-fired for one hour in air atmosphere at a temperature of 600° C., thereby decomposing $NH_4Cl$. Then, the fired material thus obtained was further subjected to firing for 3 to 7 hours in a reducing atmosphere consisting of a mixed gas of $N_2/H_2$ at a temperature ranging from 1000 to 1600° C. to obtain a first fired product. The first fired product thus obtained was pulverized and again placed into the crucible, which was then placed in a furnace. The furnace was then purged with nitrogen gas in vacuum. Further, the pulverized powder was further subjected to firing for 2 to 6 hours in a reducing atmosphere consisting of $N_2/H_2$ and having a hydrogen concentration of 5% to 100% at a temperature ranging from 1000 to 1600° C. to obtain a second fired product. This fired product was pulverized by mortar and sieved using a sieve having a mesh aperture of 75 μm, thereby obtaining the fluorescent substance of Example 1.

The excitation spectrum of this fluorescent substance is shown as a curve "a" in FIG. 2. In FIG. 2, the curve "b" shows the excitation spectrum of the fluorescent substance of Comparative Example 2. It will be seen from the curve "a" that the fluorescent substance of this example can be excited in a wide wavelength ranging from UV to yellow in the same manner as the fluorescent substance of Comparative Example 2.

FIGS. 3 and 4 show the emission spectrum obtained as the fluorescent substance of this example was excited at a wavelength of 395 nm and an X-ray diffraction pattern of the fluorescent substance of this example, respectively. The emission spectrum shown herein was obtained by measuring the emission spectrum of the fluorescent substance by using an instantaneous multi photometric system (IMUC-7000G type; Ohtsuka Denshi Co., Ltd.) as the fluorescent substance was excited by a light-emitting diode having peak wavelengths of 395 nm and 470 nm. As indicated by the emission spectrum of FIG. 3, the spectrum has a single emission peak and is free from shoulder-like up and down. In view of these facts, it will be seen that the emission spectrum to be obtained as the fluorescent substance of this example is excited by a light having a wavelength ranging from 360 nm to 500 nm will have a single peak in a wavelength ranging from 520 nm to 600 nm. Further, the X-ray diffraction pattern agrees with a JCPDS (Joint Committee on Powder Diffraction Standards) card 39-1256. Incidentally, this JCPDS card is related with the data base of powder X-ray diffraction and compiled and issued based on JCPDS. Since there is no peak in the vicinity of $2\theta=34.2°$, the fluorescent substance of this example was of orthorhombic system in crystal structure as clearly shown in the X-ray diffraction pattern of FIG. 4.

For reference, the X-ray diffraction pattern of the conventional $Sr_2SiO_4$:Eu fluorescent substance is shown in FIG. 5. This diffraction pattern agrees with JCPDS card 76-1630 and has a peak in the vicinity of $2\theta=34.2°$, and hence this fluorescent substance is of monoclinic system in crystal structure. Further, FIG. 6 shows the X-ray diffraction pattern of the conventional $(Sr,Ba)_2SiO_4$:Eu fluorescent substance. As shown in the X-ray diffraction pattern of FIG. 6, this diffraction pattern agrees with JCPDS card 39-1256 and there is no peak in the vicinity of $2\theta=34.2°$, thus indicating that the conventional $(Sr,Ba)_2SiO_4$:Eu fluorescent substance is of orthorhombic system in crystal structure. From the comparison with the X-ray diffraction pattern of FIG. 4, it will be clearly recognized that the fluorescent substance of the embodiment of the present invention is of orthorhombic system in crystal structure as in the case of the conventional fluorescent substance containing Ba.

EXAMPLE 2

First of all, a fluorescent substance having a composition represented by $(Sr_{0.915}Gd_{0.060}Eu_{0.025})_2SiO_4$ was prepared. As raw material powders, $SrCO_3$ powder, $Gd_2O_3$ powder, $Eu_2O_3$ powder and $SiO_2$ powder were prepared and weighed to obtain a prescribed quantity of mixed powders. As a crystal growth-promoting agent, $NH_4Cl$ was added to the mixed powders at an amount of 1.5% by weight based on a total quantity of the mixed powders and the resultant mixture was homogeneously mixed together by ball mill.

Figure 7:
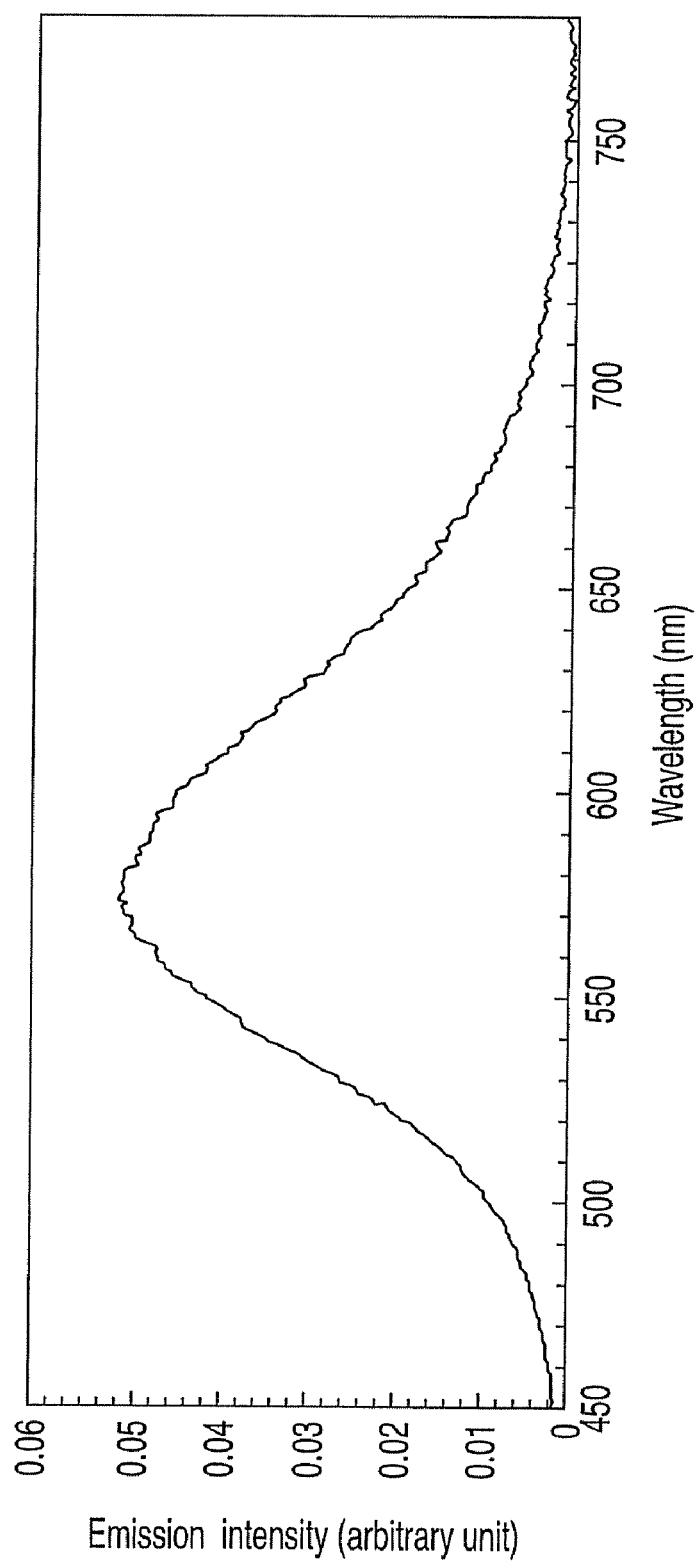
FIG. 7 is a graph illustrating an emission spectrum of the fluorescent substance of Example 2.

Thereafter, the fluorescent substance of Example 2 was obtained by following the same manufacturing method as described in Example 1. The emission spectrum of this fluorescent substance as it was excited at a wavelength of 395 nm is shown in FIG. 7. As indicated by the emission spectrum of FIG. 7, the emission spectrum obtained as the fluorescent substance of this example was excited by a light having a wavelength ranging from 360 nm to 500 nm had a single emission band in a wavelength ranging from 520 nm to 600 nm.

EXAMPLE 3

First of all, a fluorescent substance having a composition represented by $(Sr_{0.920}K_{0.055}Eu_{0.025})_2SiO_4$ was prepared. As raw material powders, $SrCO_3$ powder, KCl powder, $Eu_2O_3$ powder and $SiO_2$ powder were prepared and weighed to obtain a prescribed quantity of mixed powders. These mixed powders were homogeneously mixed together by ball mill. In this example, since the KCl employed as a raw material for K was capable of acting as a crystal growth-promoting agent, $NH_4Cl$ was not added.

Figure 8:
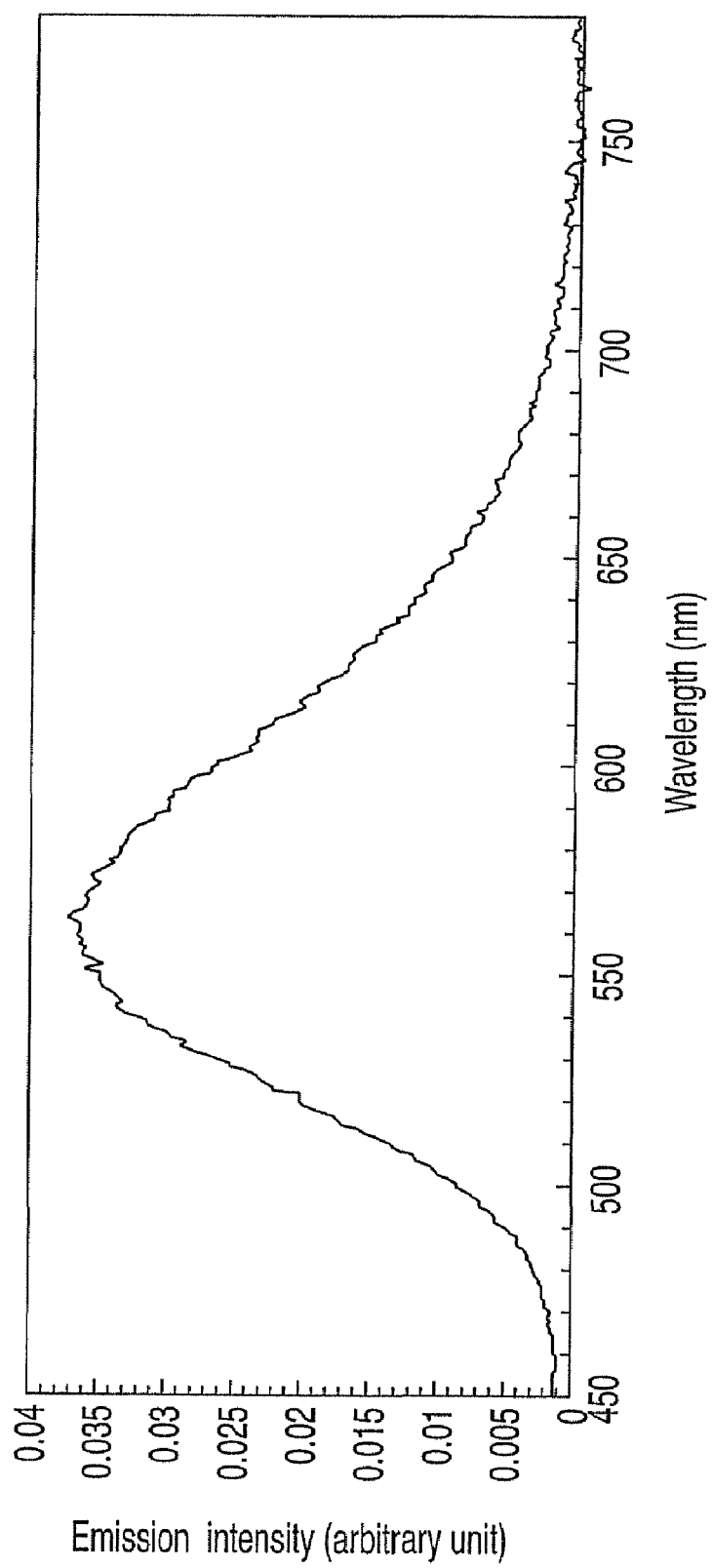
FIG. 8 is a graph illustrating an emission spectrum of the fluorescent substance of Example 3.

Thereafter, the fluorescent substance of Example 3 was obtained by following the same manufacturing method as described in Example 1. The emission spectrum of this fluorescent substance as it was excited at a wavelength of 395 nm is shown in FIG. 8. As indicated by the emission spectrum of FIG. 8, the emission spectrum obtained as the fluorescent substance of this example was excited by a light having a wavelength ranging from 360 nm to 500 nm had a single emission band in a wavelength ranging from 520 nm to 600 nm.

EXAMPLE 4

First of all, a fluorescent substance having a composition represented by $(Sr_{0.915}Cs_{0.030}La_{0.030}Eu_{0.025})_2SiO_4$ was prepared. As raw material powders, $SrCO_3$ powder, CsCl powder, $La_2O_3$ powder, $Eu_2O_3$ powder and $SiO_2$ powder were prepared and weighed to obtain a prescribed quantity of mixed powders. These mixed powders were homogeneously mixed together by ball mill. In this example, although the CsCl employed as a raw material for Cs was capable of acting as a crystal growth-promoting agent, $NH_4Cl$ was also added in order to adjust the ratio of Cl.

Figure 9:
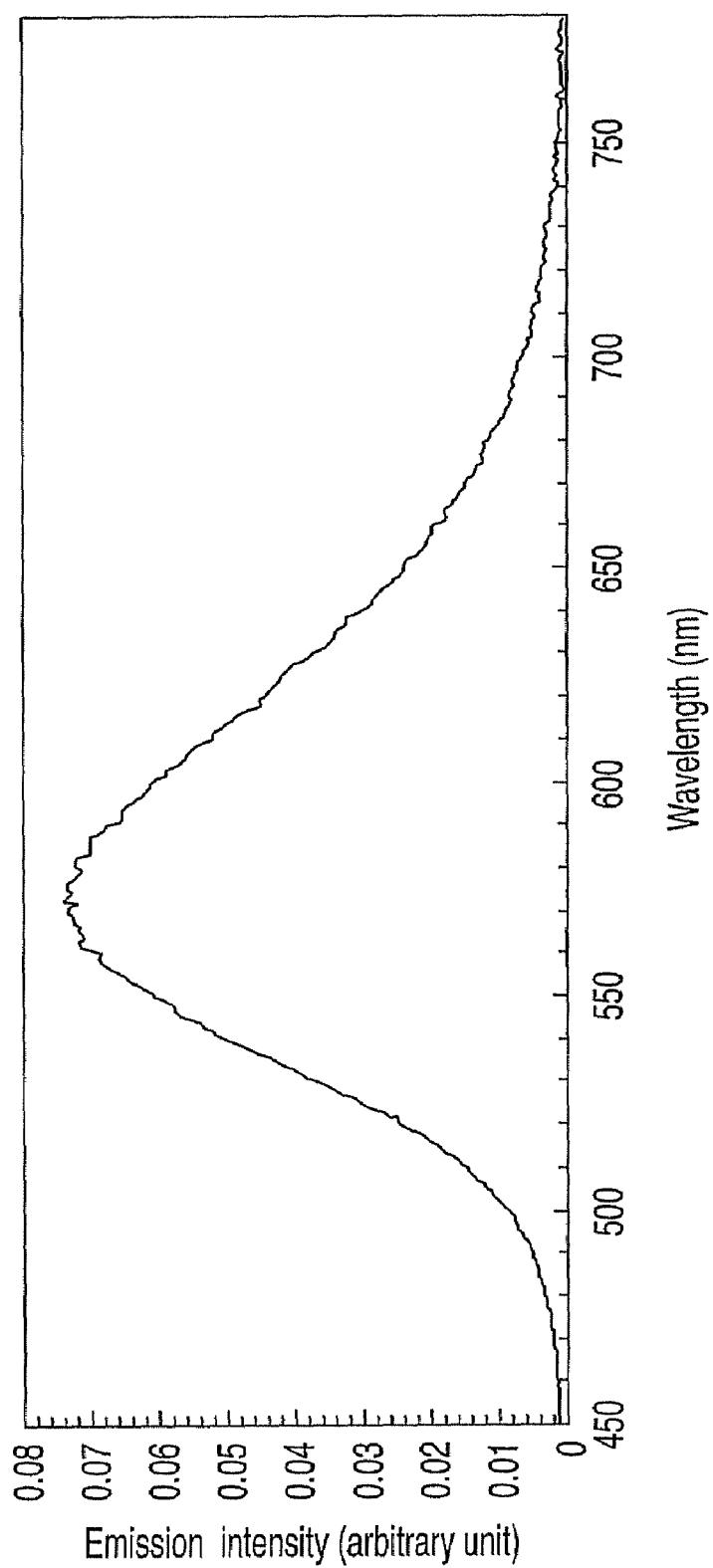
FIG. 9 is a graph illustrating an emission spectrum of the fluorescent substance of Example 4.

Thereafter, the fluorescent substance of Example 4 was obtained by following the same manufacturing method as described in Example 1. The emission spectrum of this fluorescent substance as it was excited at a wavelength of 395 nm is shown in FIG. 9. As indicated by the emission spectrum of FIG. 9, the emission spectrum obtained as the fluorescent substance of this example was excited by a light having a wavelength ranging from 360 nm to 500 nm had a single emission band in a wavelength ranging from 520 nm to 600 nm.

EXAMPLE 5

First of all, a fluorescent substance having a composition represented by $(Sr_{0.915}Ba_{0.030}La_{0.030}Eu_{0.025})_2SiO_4$ was prepared. As raw material powders, $SrCO_3$ powder, $BaCO_3$ powder, $La_2O_3$ powder, $Eu_2O_3$ powder and $SiO_2$ powder were prepared and weighed to obtain a prescribed quantity of mixed powders, which were then homogenously mixed by ball mill. As a crystal growth-promoting agent, $NH_4Cl$ was added to the mixed powders at an amount of 1.5% by weight based on a total quantity of the mixed powders and the resultant mixture was homogeneously mixed together by ball mill.

Thereafter, the fluorescent substance of Example 5 was obtained by following the same manufacturing method as described in Example 1. The emission spectrum of this fluorescent substance as it was excited at a wavelength of 395 nm indicated a peak wavelength of 575 nm, and the emission spectrum as this fluorescent substance was excited at a wavelength of 470 nm indicated a peak wavelength of 580 nm. Just like the fluorescent substances of Examples 1 to 4, the emission spectrum obtained as the fluorescent substance of this example was excited by a light having a wavelength ranging from 360 nm to 500 nm had a single emission band in a wavelength ranging from 520 nm to 600 nm.

From the results of X-ray diffraction, it was possible to confirm that the fluorescent substances of Examples 2 to 5 also were of orthorhombic system in crystal structure as in the case of Example 1.

EXAMPLE 6

LED

The fluorescent substance of Example 1, a blue fluorescent substance and a red fluorescent substance were dispersed in epoxy resin to prepare a resinous mixture. Incidentally, as for the blue fluorescent substance, an europium-activated alkaline earth chlorophosphate fluorescent substance was employed, and as for the red fluorescent substance, an europium-activated lanthanum oxysulfide fluorescent substance was employed. This resinous mixture was coated on an LED package where an LED chip exhibiting an emission peak wavelength of 395 nm was mounted thereon, thereby obtaining a light-emitting device as shown in FIG. 1.

It was confirmed that the light-emitting device thus obtained was capable of emitting a white beam excellent in color rendering properties.

EXAMPLE 7

LED

The fluorescent substance of Example 1 was dispersed in epoxy resin to prepare a resinous mixture. This resinous mixture was coated on an LED package where an LED chip exhibiting an emission peak wavelength of 470 nm was mounted thereon, thus manufacturing a white LED.

Figure 10:
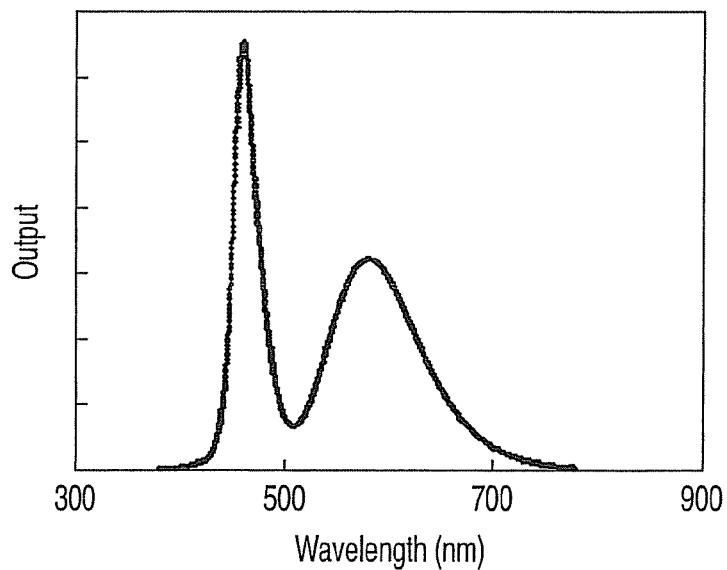
FIG. 10 is a graph illustrating an emission spectrum of a white LED comprising a combination of the fluorescent substance of Example 1 and an LED chip exhibiting an emission peak wavelength of 470 nm.

The emission spectrum of the white LED thus obtained is shown in FIG. 10. The luminescence color in this case was: x=0.337 and y=0.303 in chromaticity, and the color temperature was 5247K.

COMPARATIVE EXAMPLE 1

First of all, a fluorescent substance having a composition represented by $(Sr_{0.285}Ba_{0.665}Eu_{0.050})_2SiO_4$ was prepared. As raw material powders, $SrCO_3$ powder, $BaCO_3$ powder, $Eu_2O_3$ powder and $SiO_2$ powder were prepared and weighed to obtain a prescribed quantity of mixed powders. As a crystal growth-promoting agent, $NH_4Cl$ was added to the mixed powders at an amount of 1.5% by weight based on a total quantity of the mixed powders and the resultant mixture was homogeneously mixed together by ball mill.

Figure 11:
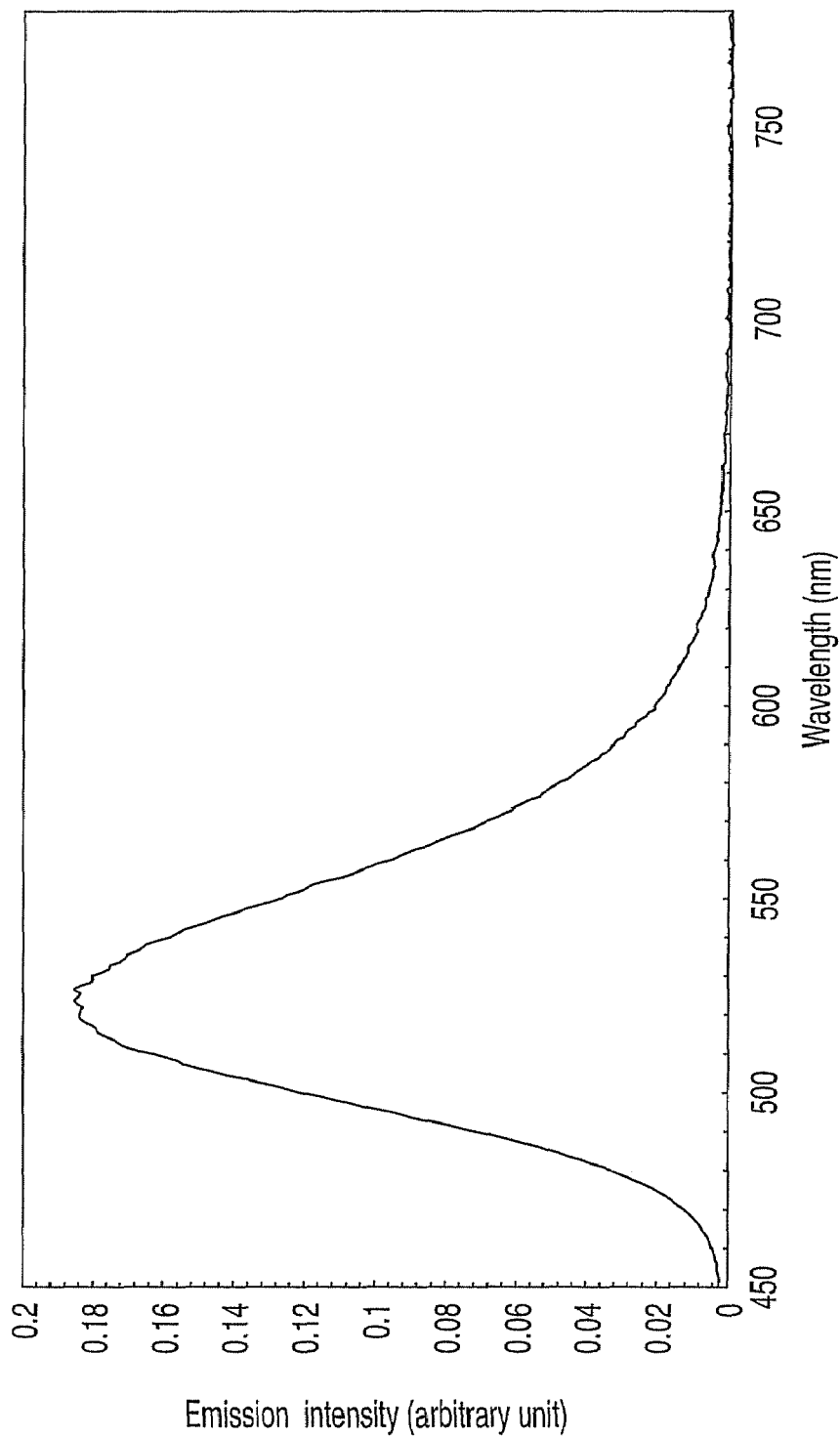
FIG. 11 is a graph illustrating an emission spectrum of the fluorescent substance of Comparative Example 1.

Thereafter, the fluorescent substance of Comparative Example 1 was obtained by following the same manufacturing method as described in Example 1. The emission spectrum of this fluorescent substance as it was excited at a wavelength of 395 nm is shown in FIG. 11. As indicated by the emission spectrum of FIG. 11, the emission spectrum obtained was green luminescence having a single emission band at a wavelength of 525 nm. However, since the fluorescent substance of this comparative example contained Ba at compositional ratio of more than 0.6, it was impossible to obviate the problem of toxicity.

COMPARATIVE EXAMPLE 2

First of all, a fluorescent substance having a composition represented by $(Sr_{0.915}Ba_{0.060}Eu_{0.025})_2SiO_4$ was prepared. As raw material powders, $SrCO_3$ powder, $BaCO_3$ powder, $Eu_2O_3$ powder and $SiO_2$ powder were prepared and weighed to obtain a prescribed quantity of mixed powders. As a crystal growth-promoting agent, $NH_4Cl$ was added to the mixed powders at an amount of 1.5% by weight based on a total quantity of the mixed powders and the resultant mixture was homogeneously mixed together by ball mill.

Thereafter, the fluorescent substance of Comparative Example 2 was manufactured in the same manner as described in Example 1.

Figure 12:
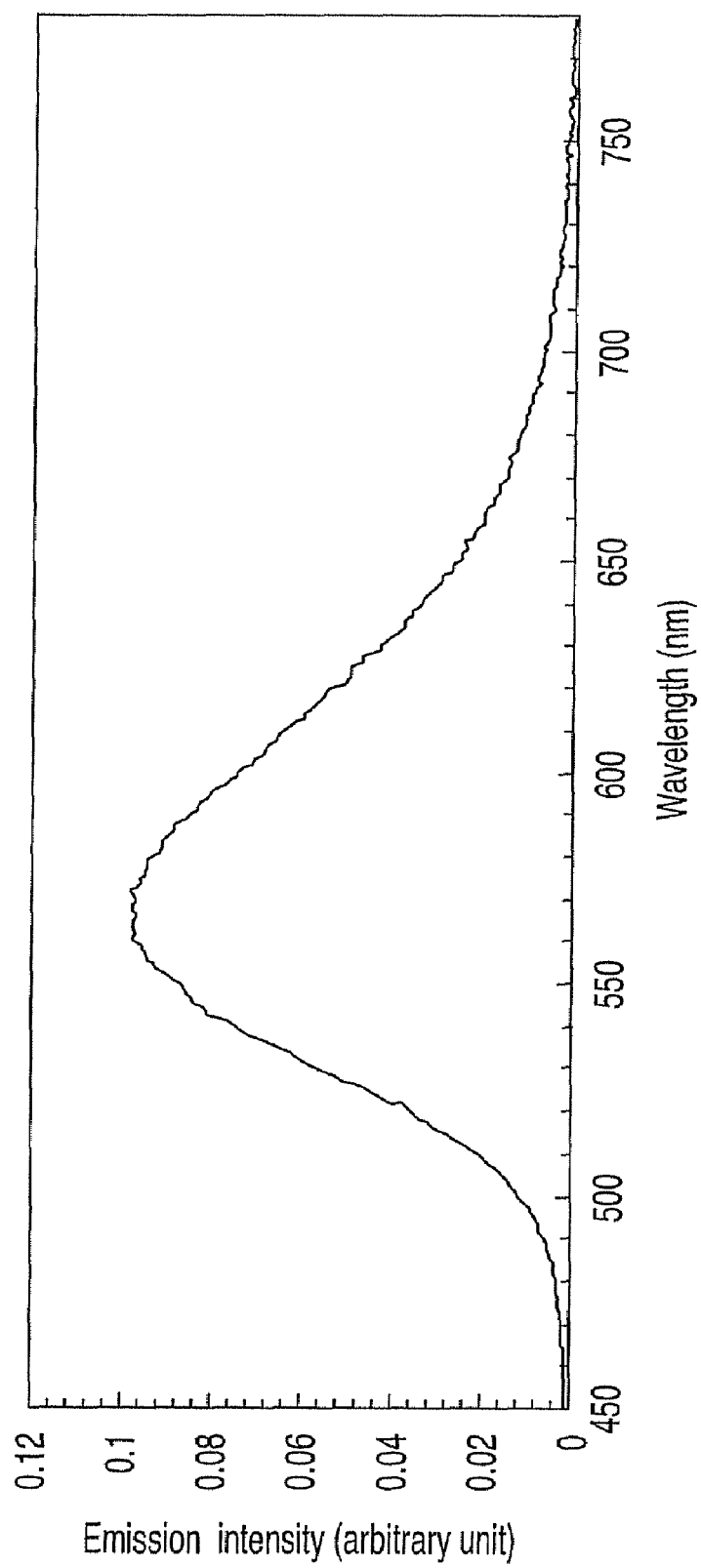
FIG. 12 is a graph illustrating an emission spectrum of the fluorescent substance of Comparative Example 2.

The emission spectrum of this fluorescent substance as it was excited at a wavelength of 395 nm is shown in FIG. 12. As indicated by the emission spectrum of FIG. 12, since the fluorescent substance of Comparative Example 2 contained Ba, the emission spectrum obtained as the fluorescent substance of this comparative example was excited by a light having a wavelength ranging from 360 nm to 500 nm had a single emission band in a wavelength ranging from 520 nm to 600 nm.

On the other hand, in the fluorescent substances according to Examples 1 to 4, even if Ba was not included in the compositions thereof, it was possible to exhibit an emission band having the same features as this comparative example. In the case of the fluorescent substance of Example 5, although it was possible to exhibit an emission band having the same features as Comparative Example 2, the quantity of Ba employed therein was a half of the quantity of Ba of Comparative Example 2.

In the following Table 1, the compositions of aforementioned Examples and Comparative Examples, emission peak and the types of crystal are summarized.

TABLE 1

| | | | | Composition (mole ratio) | | | | | | Peak emission wavelength (nm) | | |
| --- | --- | --- | --- | --- | --- | --- | --- | --- | --- | --- | --- | --- |
| | | Composition | Sr | Ba | A1 | | A2 | | Eu | Si | 395 nm Excitation | 470 nm Excitation | Crystal type |
| Example | 1 | $(Sr,A1)_2SiO_4:Eu$ | 1.83 | — | La | 0.12 | — | — | 0.05 | 1.00 | 575 | 580 | Orthorhombic system |
| | 2 | $(Sr,A1)_2SiO_4:Eu$ | 1.83 | — | Gd | 0.12 | — | — | 0.05 | 1.00 | 570 | 585 | Orthorhombic system |
| | 3 | $(Sr,A1)_2SiO_4:Eu$ | 1.84 | — | K | 0.11 | — | — | 0.05 | 1.00 | 565 | 580 | Orthorhombic system |
| | 4 | $(Sr,A1,A2)_2SiO_4:Eu$ | 1.83 | — | Cs | 0.06 | La | 0.06 | 0.05 | 1.00 | 575 | 580 | Orthorhombic system |
| | Example 5 | | 1.83 | 0.060 | La | 0.06 | — | — | 0.05 | 1.00 | 575 | 580 | Orthorhombic system |
| Comp. Ex. | 1 | $Sr_2SiO_4:Eu$ | 1.95 | — | — | — | — | — | 0.05 | 1.00 | 540 | 535 | Monoclinic system |
| | 2 | $(Sr,Ba)_2SiO_4:Eu$ | 1.83 | 0.12 | — | — | — | — | 0.05 | 1.00 | 570 | 575 | Orthorhombic system |

As shown in Table 1, the fluorescent substances according to the embodiments of the present invention where at least part of Ba is replaced by at least one selected from La, Gd, Cs and K were all formed of orthorhombic system in crystal structure. As a result, when these fluorescent substances are excited by a light having a wavelength of 395 nm or 475 nm, a single emission band generates in a wavelength ranging from 520 nm to 600 nm, thus enabling these fluorescent substances to emit luminescence excellent in color purity.

It is clear that these advantages are by no means inferior to those of the conventional Ba-containing fluorescent substance of Comparative Example 2.

According to the present invention, it is possible to provide a silicate fluorescent substance which is capable of emitting luminescence of green-yellow-orange colors excellent in color purity and having a single emission band in a wavelength ranging from 520 nm to 600 nm as it is excited by a light having a wavelength ranging from 360 nm to 500 nm. Further, according to the present invention, it is possible to provide a light-emitting device where this silicate fluorescent substance is employed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a fluorescent substance comprising:

mixing a raw material for Eu, a raw material for Si, at least one raw material powder of alkaline earth, and at least one selected from the group consisting of raw materials for La, Gd, Cs, and K to obtain a mixture of raw materials;

pre-firing the mixture for 1 to 3 hours in an air atmosphere at a temperature ranging from 500 to 700° C. to obtain a baked material;

mixing the baked material and firing for 3 to 7 hours in a reducing atmosphere consisting of a mixed gas of $N_2/H_2$ at a temperature ranging from 1000 to 1600° C. to obtain a first fired product;

pulverizing the first fired product to obtain a pulverized first fired product;

placing the pulverized first fired product into a vessel;

placing the vessel housing the pulverized first fired product in a furnace;

purging the furnace with nitrogen gas in vacuum;

firing the pulverized first fired product for 2 to 6 hours in a reducing atmosphere consisting of $N_2/H_2$ and having a hydrogen concentration of 5% to 100% at a temperature ranging from 1000 to 1600° C. to obtain a fluorescent substance consisting of an alkaline earth ortho-silicate.

2. The method according to claim 1, wherein the raw material for Eu is $Eu_2O_3$ powder.

3. The method according to claim 1, wherein the raw material for Si is $SiO_2$ powder.

4. The method according to claim 1, wherein the oxide raw material powder of alkaline earth comprises $SrCO_3$ powder.

5. The method according to claim 1, wherein the oxide raw material powder of alkaline earth comprises $CaCO_3$ powder.

6. The method according to claim 1, wherein the raw material for La is $La_2O_3$ powder.

7. The method according to claim 1, wherein the raw material for Gd is $Gd_2O_3$ powder.

8. The method according to claim 1, wherein the raw material for Cs is CsCl powder.

9. The method according to claim 1, wherein the raw material for K is KCl powder.

10. The method according to claim 1, further comprising adding a crystal growth-promoting agent to the mixture of raw materials.

11. The method according to claim 10, wherein a content of the crystal growth-promoting agent is 0.5%-30% by weight based on an entire quantity of raw material powders.

12. The method according to claim 10, wherein the crystal growth-promoting agent is selected from the group consisting of ammonium chloride, ammonium bromide, ammonium iodide, chloride of alkaline metal, bromide of alkaline metal, iodide of alkaline metal, chloride of alkaline earth metal, bromide of alkaline earth metal, and iodide of alkaline earth metal.

13. The method according to claim 1, wherein the vacuum is 1000 Pa or less.

14. The method according to claim 1, further comprising pulverizing the fluorescent substance to obtain a fluorescent particle.

15. The method according to claim 14, further comprising sieving the fluorescent particle.

16. The method according to claim 15, further comprising providing a surface-covering material on a surface of the fluorescent particle.

17. The method according to claim 16, wherein the covering material is applied to the surface of the fluorescent particle by using a dispersion or solution of the covering material.

18. The method according to claim 17, wherein the fluorescent particle is immersed in the dispersion or solution for a prescribed period of time and then dried by heating to deposit the covering material on the surface of the fluorescent particle.

19. The method according to claim 16, wherein the surface-covering material is formed of at least one selected from the group consisting of silicone resin, epoxy resin, fluorinated resin, tetraethoxy silane, silica, zinc silicate, aluminum silicate, calcium polyphosphate, silicone oil, and silicone grease.

20. The method according to claim 16, wherein the covering material is provided at a ratio of 0.1 to 50% by volume based on the volume of the fluorescent substance.

* * * * *

UNITED STATES PATENT AND TRADEMARK OFFICE
CERTIFICATE OF CORRECTION

PATENT NO. : 7,572,391 B2
APPLICATION NO. : 12/142078
DATED : August 11, 2009
INVENTOR(S) : Naomi Shida et al.

It is certified that error appears in the above-identified patent and that said Letters Patent is hereby corrected as shown below:

Title Page
The error occurs in the patent on the first page, item (57) ABSTRACT:
An field effect transistor includes a first semiconductor region, a gate electrode insulatively disposed over the first semiconductor region, source and drain electrodes between which the first semiconductor region is sandwiched, and second semiconductor regions each formed between the first semiconductor region and one of the source and drain electrodes, and having impurity concentration higher than that of the first semiconductor region, the source electrode being offset to the gate electrode in a direction in which the source electrode and the drain electrode are separated from each other with respect to a channel direction, and one of the second semiconductor regions having a thickness not more than a thickness with which the one of second semiconductor regions is completely depleted in the channel direction being in thermal equilibrium with the source electrode therewith.

It should read:
(57) ABSTRACT
A method of manufacturing a fluorescent substance is provided, which includes mixing a raw material for Eu, a raw material for Si, at least one raw material powder of alkaline earth, and at least one selected from the group consisting of raw materials for La, Gd, Cs, and K to obtain a mixture of raw materials; pre-firing the mixture to obtain a baked material; mixing the the baked material and firing in a reducing atmosphere consisting of a mixed gas of $N_2/H_2$ to obtain a first fired product; pulverizing the first fired product to obtain a pulverized first fired product; firing the pulverized first fired product in a reducing atmosphere consisting of $N_2/H_2$ to obtain a fluorescent substance consisting of an alkaline earth ortho-silicate; pulverizing the fluorescent substance to obtain a fluorescent particle; sieving the fluorescent particle; and providing a surface-covering material on a surface of the fluorescent particle.

Signed and Sealed this

Twenty-second Day of June, 2010

David J. Kappos
*Director of the United States Patent and Trademark Office*